United States Patent [19]

Uchida

[11] Patent Number: 5,187,771

[45] Date of Patent: Feb. 16, 1993

[54] HEAT PROCESSING APPARATUS UTILIZING A PLURALITY OF STACKED HEATER HOLDERS

[75] Inventor: Yoshinobu Uchida, Hachioji, Japan

[73] Assignee: Tokyo Electron Sagami Limited, Kanagawa, Japan

[21] Appl. No.: 791,134

[22] Filed: Nov. 13, 1991

[30] Foreign Application Priority Data

Nov. 13, 1990 [JP] Japan .............................. 2-118791[U]

[51] Int. Cl.⁵ ...................... H01L 21/22; F27D 11/02
[52] U.S. Cl. ..................................... 392/416; 219/532;
219/542; 373/110; 338/318; 338/321; 174/150;
174/138 J; 174/163 R; 118/725
[58] Field of Search ............... 392/416, 418; 219/542,
219/532, 402, 390; 373/110, 128, 130; 338/304,
305, 318, 319, 321; 174/150, 138 J, 163 R, 50,
52.1, 138 R, 168, 174; 118/725, 50.1

[56] References Cited

U.S. PATENT DOCUMENTS

| 635,133 | 10/1899 | Gold ..................................... 338/304 |
| 1,649,925 | 11/1927 | Ruckstahl ............................ 373/128 |
| 3,395,241 | 7/1968 | Roman ................................. 338/304 |
| 4,849,608 | 7/1989 | Muraoka et al. .................... 219/390 |
| 5,095,192 | 3/1992 | McEntire et al. ................... 219/390 |

FOREIGN PATENT DOCUMENTS 62-170186 7/1987 Japan .
63-145291 9/1988 Japan .
1-10921 3/1989 Japan .

Primary Examiner—Bruce A. Reynolds
Assistant Examiner—John A. Jeffery
Attorney, Agent, or Firm—Oblon, Spivak, McClelland, Maier & Neustadt

[57] ABSTRACT

A heat processing apparatus comprises a reactor tube in which matters to be processed are housed, a wire-shaped heating unit enclosing the reactor tube, a support device for supporting the heating unit at plural positions, and reinforcing members for reinforcing the support device. The support device includes plurality of holders stacked one upon the others, each of the holders has recesses on those two faces thereof which are contacted with faces of its adjacent ones, and when the holders are stacked one upon the others in a pole, the recesses of the two adjacent holders stacked form a hole through which the heating unit is passed. The support device has support members each supporting a pole of the holders stacked and each of the holders is engaged with its corresponding support member.

15 Claims, 4 Drawing Sheets

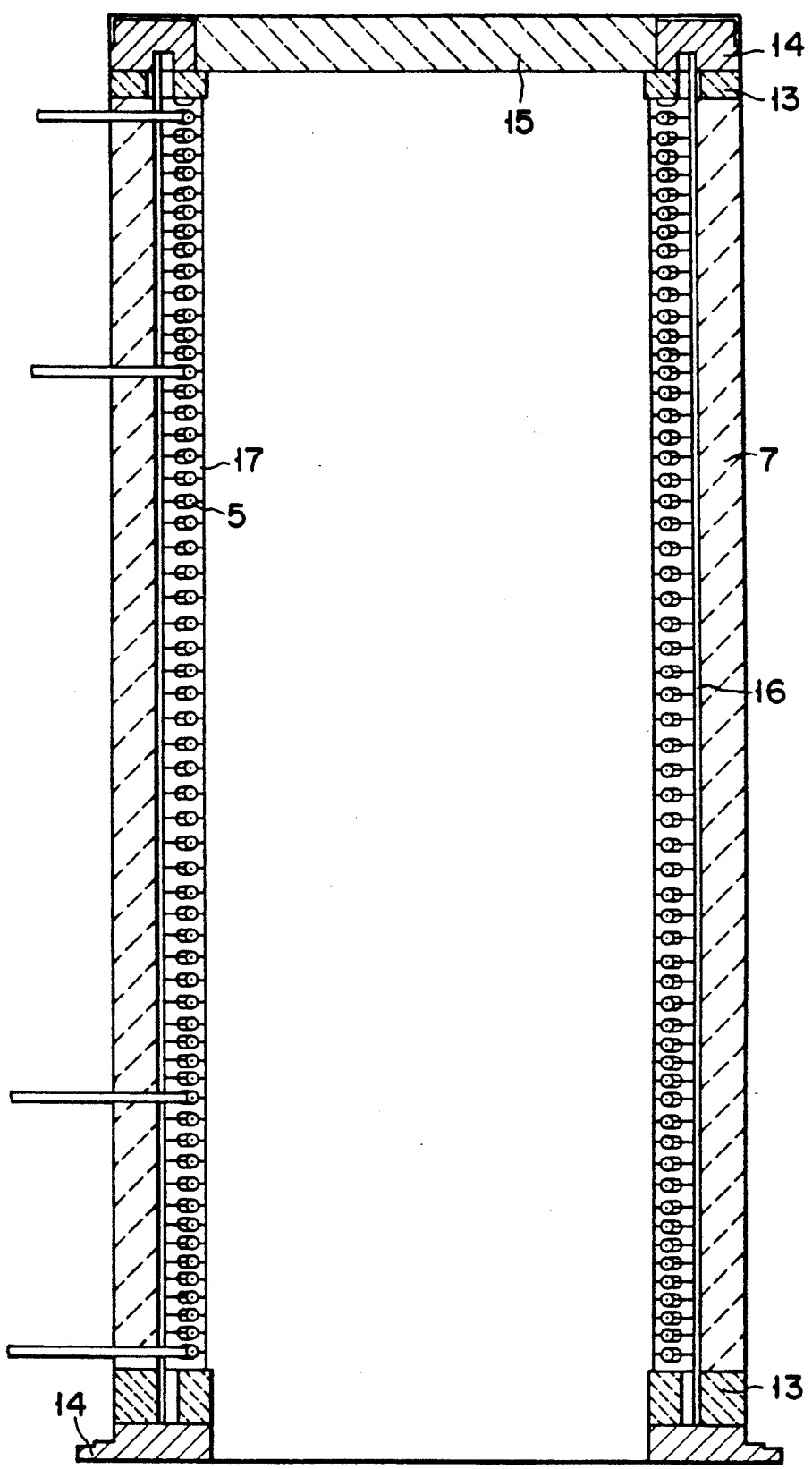
F I G. 3

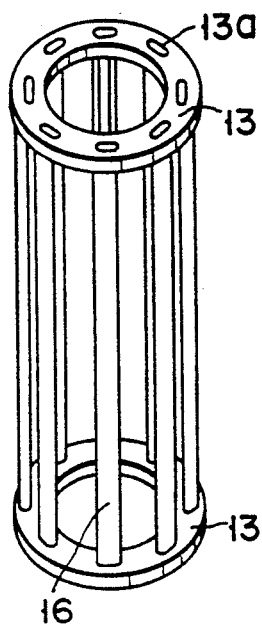
F I G. 4
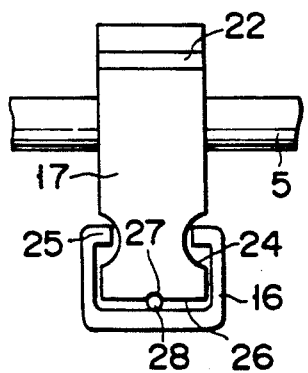
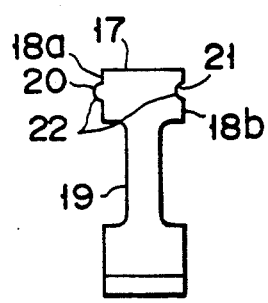
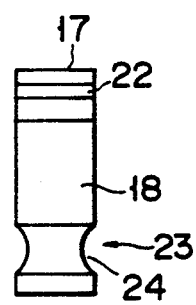
F I G. 6  F I G. 5A  F I G. 5B

HEAT PROCESSING APPARATUS UTILIZING A PLURALITY OF STACKED HEATER HOLDERS

Background of the Invention

1. Field of the Invention

The present invention relates to a heat processing apparatus employed in the course of manufacturing semiconductors.

2. Description of the Related Art

The heat processing apparatus of the vertical type is well known as intending to form film on semi-conductor wafers in the semi-conductors manufacturing process. This heat processing apparatus of the vertical type is more often used as the wafers are larger-sized in diameter because temperature can be kept uniform at surfaces of the wafers which are to be processed.

The heat processing apparatuses of the vertical type are disclosed in Japanese Utility Model Disclosures Sho 63-145291 and Hei 1-10921, for example. In the case of the heat processing apparatus disclosed in Japanese Utility Model Disclosure Sho 63-145291, means for supporting a heater wire has a plurality of heater holders and the heater holders stacked one upon the others like a pole form a heater wire support hole which is shaped substantially like an oval in section and which has such a size that allows the heater wire to move therein. The heater holders stacked form eight poles and each pole of the holders stacked is supported by each of support members which are arranged at eight positions around a reactor tube.

In the case of the heat processing apparatus disclosed in Japanese Utility Model Disclosure Hei 1-10921, the front end of each of the heater holders is shaped like S in section and those upper and lower portions of the heater wire which face the front end of the heater holder are held in the S-shaped grooves of the heater holder.

The heater holders are usually made of heat-resistant ceramics because the heater wire in the heat processing apparatus is heated to a temperature of about 1200° C. Ceramics is neither expanded by heat nor flexible. When the heater wire is expanded by heat, therefore, the heater wire holders are pulled in radial and circumferential directions thereof by the heat-expanded heater wire. The heater wire support recess or hole of each heater holder is therefore made large enough to allow the heater wire to be heat-expanded, but the heater holders are sometimes cracked by the heat-expanded heater wire.

Particularly because the heater wire is fixedly connected to a terminal, the heater holders and the support member are liable to be broken by the heat expansion of that portion of the heater wire which is fixed to the terminal and when the heater holders and the support member are broken, their chips are spread to contaminate the wafers and the reactor tube is sometimes broken by the deformed heater wire.

SUMMARY OF THE INVENTION

The object of the present invention is therefore to provide a heat processing apparatus wherein heater support means is not broken by the heater wire heat-expanded and their chips are not spread even when they are broken.

This object of the present invention can be achieved by a heat processing apparatus comprising a reactor tube in which items to be heated are housed, a wire-shaped heating unit enclosing the reactor tube, means for supporting the heating unit at plural positions, and means for reinforcing support members of the support means. The support means has a plurality of holders stacked one upon the others, each of the holders has recesses on those two faces thereof which are contacted with faces of its adjacent ones, and when the holders are stacked one upon the others like a pole, the recesses of the two adjacent holders stacked form a hole through which the heating unit is passed. The support means has the support members each supporting a pole of the holders stacked and each of the holders stacked like a pole is engaged with its corresponding support member.

Because of the reinforcing means provided by the present invention, the holders and the support member cannot be broken even when the support member is pulled by the heat-expanded heating unit. Even if they should be broken, their chips cannot be spread. The items to be heated can be therefore heat-processed with a higher productivity while keeping them clean.

Additional objects and advantages of the invention will be set forth in the description which follows, and in part will be obvious from the description or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view taken along a line 3—3 in FIG. 2;

FIG. 4 is a perspective view showing a support member assembled for use with the heat processing apparatus;

FIGS. 5A and 5B are side and plan views showing a heater holder intended to be used by the heat processing apparatus;

FIGS. 6 and 7 are plan and perspective views showing how the heater holders and the support members are combined with a heater;

DETAILED DESCRIPTION OF THE PREFERRED EMBODIMENTS

Some embodiments of the present invention will be described with reference to the accompanying drawings.

Figure 1:
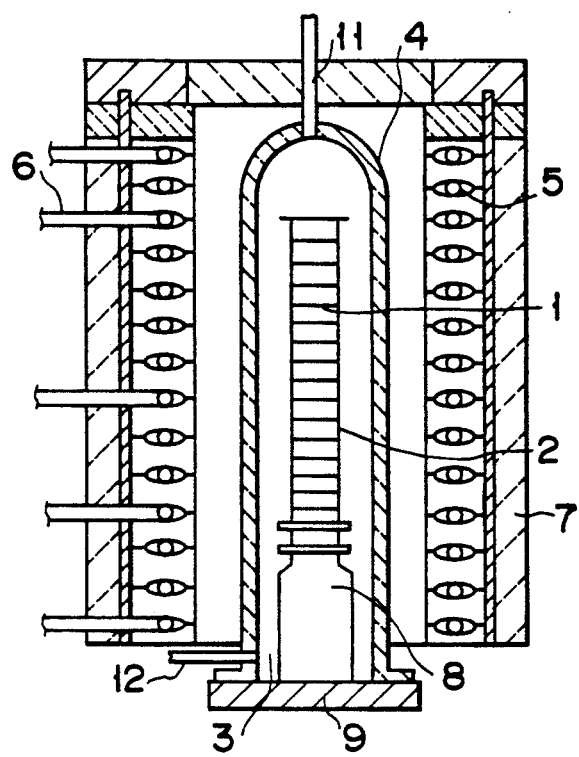
FIG. 1 is a vertically-sectioned view showing the heat processing apparatus according to an embodiment of the present invention.

The heat processing apparatus according to an embodiment of the present invention has a cylindrical reactor tube 4 made of heat resistant material such as quartz, as shown in FIG. 1, and wafers 1 housed in a quartz-made boat 2 are heat-processed in the reactor tube 4. The reactor tube 4 is provided at the bottom thereof with an opening 3 through which the quartz-made boat 2 in which the wafers 1 are housed is carried into and out of the reactor tube 4. The quartz-made boat 2 is mounted on a temperature-keeping cylinder 8 in which a heater means is housed, and the temperature-keeping cylinder 8 is mounted on a lid 9 which opens and closes the opening 3 of the reactor tube 4. This id 9 is therefore moved up and down by a lifter system (not shown).

Heaters 5 each made of resistance heating material such as iron-chromium-aluminium alloy and shaped like a spiral are arranged around the reactor tube 4. The heaters 5 are divided into several zones to uniformly heat the space in the reactor tube 4 in which the wafers 1 are housed. The heater 5 in every zone has a terminal 6 through which current is supplied to the heater 5. This enables every zone to have a predetermined temperature due to its related heater 5.

The reactor tube 4 has a reaction gas supply pipe 11 at the top thereof and a reaction gas exhaust pipe 12 adjacent to the open bottom thereof. Film is formed on the wafers 1 by reaction gas supplied via the reaction gas supply pipe 11, and reacted and surplus gas is exhausted through the reaction gas exhaust pipe 12 after the film forming step.

Figure 2:
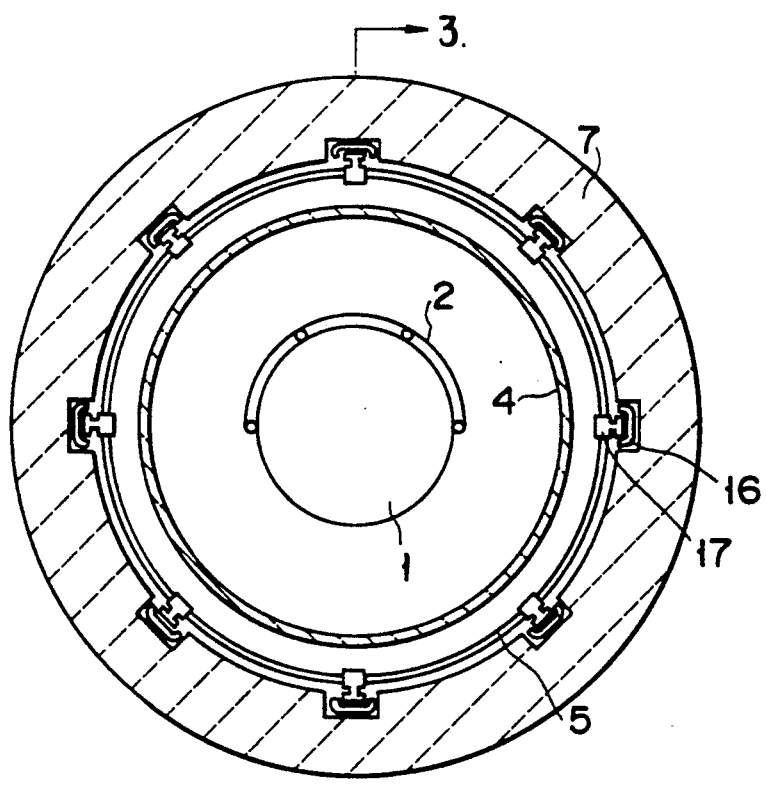
FIG. 2 is a horizontally-sectioned view showing the heat processing apparatus.

As shown in FIGS. 2 and 3, a heat insulating member 7 is arranged around the reactor tube 4 and a support member 16 usually having a length more than 1$m$ and a C-shaped section is arranged in each of eight recesses formed on the inner face of the heat insulating member 7. A plurality of heater holders 17 are stacked one upon the others along each of the eight recesses in which the support members 16 are positioned, respectively, and the heater 5 in each zone is supported by these heater holders 17. The support members 16 and the heater holders 17 are molded using ceramics ($Al_2O_3$) whose particles are relatively fine.

As shown in FIG. 4, the eight support members 16 are held at their both ends by ring-like heat insulating members 13. More specifically, each of the ring-like heat insulating members 13 is provided with eight holes 13$a$ which are formed in the circumferential direction of the member 13 at a same interval and into which ends of the support members 16 are fitted. The ring-shaped heat insulating members 13 are made by hardening ceramic fibers.

As shown in FIG. 3, the ring-like heat insulating members 13 are held between a pair of frames 14. The open top of the upper heat insulating member 13 is closed by an upper disk-shaped lid 15 made of heat insulating material. The whole of the heat processing furnace constructed as described above is enclosed by a cover (not shown).

As shown in FIGS. 5A and 5B, recesses 19 are formed on those faces 18 of the adjacent heater holders 17 which are contacted with each other so as to hold the heater 5 therein. The size of a space formed by these recesses 19 is determined considering the heat expansion of the heater 5. In other words, the space is designed to have such a size that allows the heater 5 to be movable in the circumferential direction thereof when it is expanded by its own heat.

Each of the heater holders 17 has a projection 20 on a contacted face 18$a$ and a recess 21 on another contacted face 18$b$, and the projection 20 of one heat holder 17 and the recess 21 of its adjacent one 17 form an engagement section 22 to prevent these two adjacent heater holders 17 from being shifted from each other Further, grooves 24 are formed on those faces 23 of the heat holder 17 which are perpendicular to the faces 18 thereof, and front ends 25 of the C-shaped section of the support member 16 are engaged with these grooves 24 of the heater holders 17, so that the heater holders 17 can be supported freely detachable by the support member 16.

Figure 7:
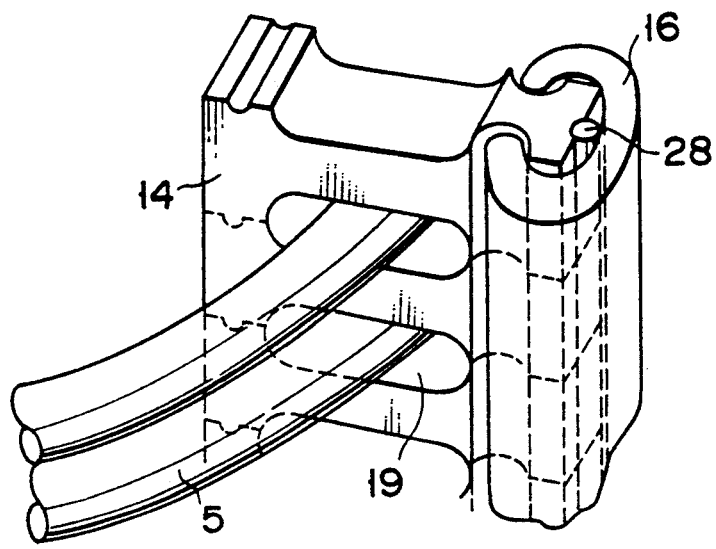

As shown in FIGS. 6 and 7, a semi-circular recess 27 is formed on those faces of the heat holders 17 which face the support member 16 and a heat-resistant reinforcing column 28 is fitted into this recess 27 of the heat holders 17. The heat-resistant reinforcing column 28 is made of nickel-steel alloy such as Incone high in strength.

In the case where film is to be formed on the semiconductor wafers, using the heat processing apparatus arranged as described above, current is supplied to the heaters 5 to heat the reactor tube 4 to a predetermined temperature and the wafers 1 on the quartz-made boat 2 are carried into the reactor tube 4 through the opening 3. Reaction gas is supplied into the reactor tube 4 through the reaction gas supply pipe 11 and a film-forming step is applied to the wafers 1. Gas reacted at the film-forming step is exhausted outside the reactor tub 4 through the reaction gas exhaust pipe 12.

The heater 5 is partially expanded and deformed by its own heat when current is supplied to it, but it is allowed in this case to move in the space between two adjacent recesses 19 of the heater holders 17. Even when the most of it is expanded, it can be held by the heater holders 17 engaged with the support member 16.

In a case where the heater 5 is deformed at that end connected to the terminal 6 by its heat expansion and the heater holders 17 are thus loaded with strong force to locally pull the support member 16, the reinforcing column 28 made of nickel-steel alloy high in strength can prevent the support member 16 and the heater holders 17 related to this support member 16 from being broken.

Figure 8:
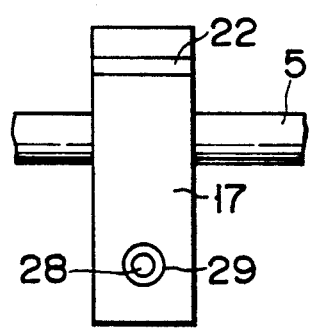
FIG. 8 is a plan showing a variation of the heater holder.

A first variation of the heater holder 17 shown in FIG. 8 is intended for the heat processing apparatus of the low temperature type which is heated to about 700° C. In the case of this variation, a through-hole 29 is formed passing through the heater holders 17 along the support member 16 and the heat-resistant reinforcing column 28 is inserted into the through-hole 29 to support the heater holders 17 which are stacked one upon the others. The grooves 24 of the heater holders 17 which are engaged with the front ends 25 of the support member 16 are thus made unnecessary, thereby making the manufacturing cost of the heater holder 17 lower.

The through-hole 29 may be made plural. Even in the case where the front ends 25 of the support member 16 are engaged with the grooves 24 of the heater holders 17, it may be arranged that the through-hole 29 is formed passing through the base end portions of the heater holders 17 along the support member 16 and that the reinforcing column 28 is inserted into the through-hole 29 of the heater holders 17.

Figure 9:
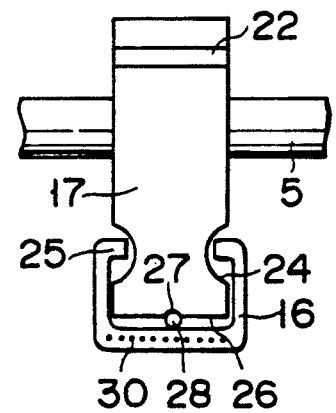
FIG. 9 is a plan showing another variation of the heater holder.

A second variation of the heater holder 17 shown in FIG. 9 is intended for the heat processing apparatus of the high temperature type which is heated to about 1000° C. In the case of this second variation, reinforcing members 30 each made of ceramic fibers are embedded in the support member 16 which is made by molding ceramics When the support member 16 is reinforced in this manner, it cannot be broken and damaged.

The heaters support arrangement according to the present invention is also suitable for use with other heating apparatuses in addition to the heat processing one.

It should be understood that the present invention is not limited to the embodiment and its variations but that various changes and modifications can be made without departing from the spirit and scope of the present invention.

What is claimed is:

1. A heat processing apparatus comprising:
    a reactor tube in which objects to be heated are housed;
    a wire-shaped heating unit enclosing the reactor tube;
    support means for supporting the heating unit at plural positions, wherein said support means has a plurality of holders stacked one upon the others and each of said holders has recesses on those two faces thereof which are contacted with faces of its adjacent holders, and wherein when the holders are stacked one upon the others, the recesses of said two adjacent holders form a hole through which the heating unit is passed, and wherein said support means has support members each serving to support a pole of the holders stacked one upon the others, and each of the holders stacked one upon the others in a pole are engaged with their corresponding support member; and
    reinforcing means, which includes heat-resistant reinforcing columns each being interposed between the holders and the support member, for reinforcing each of the support members of the support means.

2. The heat processing apparatus according to claim 1, wherein each of said reinforcing columns is inserted into a recess formed on those faces of the stacked holders which face the support member.

3. The heat processing apparatus according to claim 1, wherein each of said reinforcing columns is passed through a through-hole which is formed passing through the holders stacked like a pole.

4. The heat processing apparatus according to claim 1, wherein said reinforcing columns are made of Inconel.

5. The heat processing apparatus according to claim 1, wherein each of said support members has a long channel C-shaped in section.

6. The heat processing apparatus according to claim 5, wherein each of the holders has grooves on the other two faces thereof and those rim ends of the channel of the support member which are opposed to each other are engaged with these grooves of the holders stacked like a pole.

7. The heat processing apparatus according to claim 1, wherein said support members are molded by ceramics.

8. The heat processing apparatus according to claim 1, wherein said holders are molded by ceramics and each of said holders stacked has engagements or stoppers on those two faces thereof which are contacted with faces of its adjacent ones, and these engagements of each holder are engaged with those of its adjacent ones.

9. The heat processing apparatus according to claim 1, wherein said wire-shaped heating unit is divided into plural zones, said apparatus further comprising an electrode to supply current to each of these zones of said heating unit.

10. The heat processing apparatus according to claim 1, further comprising an insulating member enclosing the reactor tube, the heating unit and the support means.

11. The heat processing apparatus according to claim 1, wherein said support means includes plural support members each supporting a pole of the stacked holders, said support members being positioned on a circle at a predetermined interval, and a pair of heat insulating rings between which said support members are held at their both ends.

12. The heat processing apparatus according to claim 11, wherein each of said heat insulating rings is made by hardening ceramic fibers.

13. A heat processing apparatus comprising;
    a reactor tube in which matters to be processed are housed;
    a wire-shaped heating unit enclosing the reactor tube; and
    support means for supporting the heating unit at plural positions, wherein said support means has a plurality of holders stacked one upon the others and columns and each of said holders has recesses on those two faces thereof which are contacted with faces of its adjacent ones, and wherein when said holders are stacked one upon the others, the recesses of said two adjacent holders form a hole through which the heating unit is passed, and wherein said holders stacked like a pole has a through-hole extending in a direction in which the holders are stacked one upon the others, and said column is passed through the through-hole of said holders.

14. The heat processing apparatus according to claim 13, wherein said columns are made of Inconel.

15. The heat processing apparatus according to claim 13, wherein said holders are molded by ceramics and each of said holders has engagements or stoppers on those two faces thereof which are contacted with faces of its adjacent ones.

* * * * *